United States Patent
Gordon, II et al.

[11] Patent Number: 5,767,624
[45] Date of Patent: Jun. 16, 1998

[54] LIGHT EMITTING DEVICE

[75] Inventors: Joseph Grover Gordon, II, San Jose, Calif.; Sigfried Friedrich Karg, Solnhofen, Germany; James Harvey Kaufman, San Jose, Calif.; Martin Kreyenschmidt, Worms-Pfeddersheim, Germany; Robert Dennis Miller, San Jose; John Campbell Scott, Los Gatos, both of Calif.

[73] Assignee: International Business Machines Corporation, Armonk, N.Y.

[21] Appl. No.: 670,480

[22] Filed: Jun. 26, 1996

[51] Int. Cl.$^6$ ............................................. H01J 1/62
[52] U.S. Cl. ........................................ 313/509; 313/506
[58] Field of Search ............................. 313/358, 509, 313/505, 506, 507, 508

[56] References Cited

U.S. PATENT DOCUMENTS

| | | | |
|---|---|---|---|
| 3,883,768 | 5/1975 | Voinov et al. | 313/358 |
| 4,042,632 | 8/1977 | Hofer, Sr. et al. | 260/607 AL |
| 4,096,274 | 6/1978 | Reuschling et al. | 424/274 |
| 4,401,545 | 8/1983 | Naarmann et al. | 204/291 |
| 4,501,686 | 2/1985 | Hotta et al. | 252/500 |
| 4,582,587 | 4/1986 | Hotta et al. | 204/291 |
| 4,640,749 | 2/1987 | Naarmann et al. | 204/59 R |
| 4,911,801 | 3/1990 | Pons | 204/59 R |
| 4,933,106 | 6/1990 | Sakai et al. | 252/500 |
| 4,973,391 | 11/1990 | Madou et al. | 204/78 |
| 4,986,886 | 1/1991 | Wei et al. | 204/78 |
| 5,002,700 | 3/1991 | Otagawa et al. | 252/500 |
| 5,066,731 | 11/1991 | Feldhues et al. | 252/500 |
| 5,098,529 | 3/1992 | Feldhues | 204/59 R |
| 5,120,407 | 6/1992 | Kim et al. | 204/59 R |
| 5,198,153 | 3/1993 | Angelopoulos et al. | 252/500 |
| 5,281,363 | 1/1994 | Schacklette et al. | 252/500 |
| 5,328,580 | 7/1994 | Reamey | 204/181.1 |
| 5,378,560 | 1/1995 | Tomiyama | 429/217 |

FOREIGN PATENT DOCUMENTS

WO9600983-A1  1/1996  WIPO ..................... H01L 35/24

OTHER PUBLICATIONS

S. Miyata et al., "Novel Light Emitting Devices of Organic Thin Films", Proceedings the 29th Seminar, Cooperative Research Center, Tokyo University Of Agriculture and Technology, Jul. 21, 1995.

Q. Pei et al., "Polymer Light–Emitting Electrochemical Cells", Science, vol. 29 25 Aug. 1995.

D. B. Romero et al., "Effects of Doping in Polymer Light–Emitting Diodes", Appl. Phys. Lett. 67, (12), 18 Sep. 1995.

J. Kido, "Recent Advances in Organic Electroluminescent Devices", Bulletin of Electrochemistry 10 (1) Jan. 1994, pp. 1–13.

*Primary Examiner*—Sandra L. O'Shea
*Assistant Examiner*—Joseph Williams
*Attorney, Agent, or Firm*—Robert B. Martin

[57] ABSTRACT

The invention relates to an organic electroluminescent device comprising a light emitting composition disposed between a first and second electrode. The composition comprises a charge transporting polymer and an organic salt comprising immobilized anions and cations nonuniformly distributed in the polymer matrix.

11 Claims, 1 Drawing Sheet

LIGHT EMITTING DEVICE

FIELD OF THE INVENTION

The present invention relates to a light emitting device and in particular relates to an organic electroluminescent device.

BACKGROUND OF THE INVENTION

Inorganic electroluminescent devices are known in the art. The device generally comprises a thin film of phosphor disposed between two electrodes one of which is transparent. The phosphor generally comprised gallium arsenide doped with aluminum or phosphorous. Upon application of a current, the phosphor emits light. However, these devices can not be easily fabricated in large areas or arrays.

Organic electroluminescent devices are also known in the art as disclosed in U.S. Pat. Nos. 4,356,429 and 4,539,507. Pei et al., in Science 269, 1086 (Aug. 25, 1995) also discloses an organic electroluminescent composition comprising poly(1,4-phenylene vinylene), poly(ethylene oxide) and lithium trifluoromethane sulfonate. Pei describes the luminescent process as forming n-type and p-type carriers on opposite sides of the composition adjacent to the electrodes followed by charge migration, combination and radiative decay. Pei indicates the dynamic response of the material is determined by the ionic mobility of the counter ions e.g., the time required for the counter ions of the sulfonate salt to form concentration gradients near the electrodes. The dynamic response time of the Pei device is lower than desired in many applications. Further, the dynamic response time of Pei varies depending on whether the counter ions are uniformly or nonuniformly distributed in the composition when the voltage is applied. Lastly, the power consumption of Pei is higher than desired due to the extra power consumed to continuously reestablish concentration gradients during use of the display. There is a continuing desire in the industry for shorter dynamic response time and less power consumption.

It is therefore an object of the present invention to provide an improved electroluminescent device.

Other objects and advantages will become apparent from the following disclosure.

SUMMARY OF THE INVENTION

The present invention relates to a light emitting device comprising a light emitting composition disposed between a first and second electrode. The composition comprises a charge transporting polymer and a salt comprising anions and cations. The cations and anions are immobilized in the polymer matrix during fabrication of the device and have a nonuniform spatial distribution in the composition to form fixed ion concentration gradients at each electrode with the anion concentration being higher at the first electrode and the cation concentration being higher at the second electrode. The immobilized nonuniform distribution of ions in the polymer matrix enables the device to emit light in less than 10 milliseconds after application of a voltage to the first and second electrode.

The present invention also relates to the process for making the light emitting device.

A more thorough disclosure of the present invention is presented in the detailed description which follows and from the drawing.

DETAILED DESCRIPTION OF THE INVENTION

Figure 1:
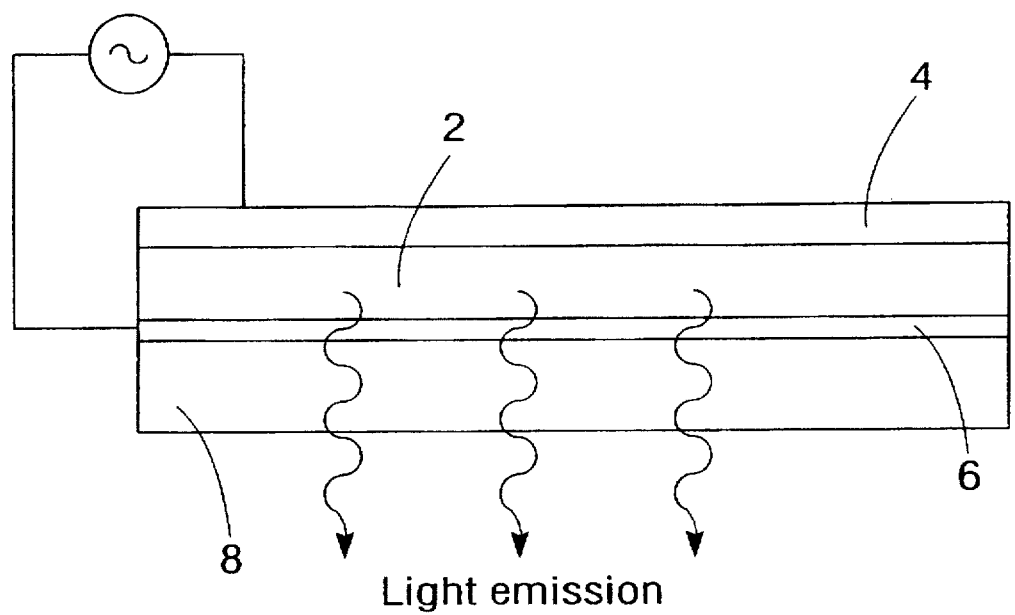
FIG. 1 is a cross-sectional view of an embodiment of the light emitting device of the present invention.

The present invention relates to a light emitting device comprising a light emitting composition disposed between a first and second electrode.

Referring to FIG. 1, there is shown an embodiment of the device comprising the light emitting composition 2 sandwiched between and contiguous with opaque electrode 4 and transparent electrode 6. The device is supported on a glass base 8. When a voltage is applied to electrodes 4 and 6 light is emitted from composition 2 and radiates from the device through transparent electrode 6 and glass base 8.

The light emitting composition 2 comprises a charge-transporting, conjugated polymer and a salt. Suitably, the polymers will be capable of transporting electrical charge and will have a glass transition temperature of greater than about 120° C. preferably greater than about 180° C. to enable immobilization of ions within the polymer matrix at ambient operating temperature (e.g., ~20° C.). Suitable polymers for use in the composition of the present invention are poly(phenylene vinylene) e.g., poly(1,4 phenylene vinylene); poly-(2,5-dialkoxy-1,4 phenylene vinylene)]; poly(2,5-dialkyl-1,4 phenylene vinylene); poly(phenylene) e.g., poly(2,5-dialkyl-1,4 phenylene); poly (p-phenylene); poly(thiophene) e.g., poly(3-alkylthiophene); poly(fluorene) e.g., poly(9,9-dialkyl fluorene) and copolymers of the above functionalities where the alkyl and alkoxy substituents are $C_{1-20}$. The polymers can also be substituted with aryl substituents e.g., phenyl and benzyl. Other suitable polymers will be known to those skilled in the art.

The light emitting composition also comprises a salt, preferably an organic salt. Preferably, both the anion and the cation of the salt have bulky groups (e.g., organic groups) which inhibit movement of the ions in the polymer matrix. Suitable organic salts are tetra alkyl, aryl or hetero aryl quaternary ammonium salts including tetra $C_{1-6}$ alkyl ammonium toluenesulfonate, tetra $C_{1-6}$ alkyl ammonium tetrafluoroborate, and tetra $C_{1-6}$ alkyl ammonium tetraphenylborate. Other suitable organic salts will be known to those skilled in the art.

During fabrication of the device, the cations and the anions are nonuniformly distributed and immobilized in the polymer matrix. The anions and cations form fixed concentration gradients in the composition. At the anode electrode, there is a higher concentration of anions than cations with the highest concentration of anions being contiguous to the surface of the anode. The concentration of anion diminishes with the distance from the anode. Midway between the anode and cathode there is substantially equal concentration of anions and cations. The smallest concentration of anions is adjacent the cathode. The cathode electrode has a similar fixed concentration gradient of cation. Both the cation and anion are immobilized in the polymer matrix. The immobilized cations and anions will have a room temperature (15° C.) diffusion coefficient in the absence of an electric field of less than $10^{-21}$ meter$^2$/sec, preferably less than $10^{-22}$ m$^2$/sec. The immobilized cation and anions generally have room temperature ionic mobility of less than $10^{-19}$m$^2$/volt •sec.

The electrodes 4 and 6 of the device comprise a conductive material. Suitable opaque electrodes can comprise gold, aluminum, copper, silver or alloys thereof or a polymer such as polyaniline. Suitable transparent electrodes comprise indium tin oxide or polythiophene.

The device of the present invention can be used in flat panel displays, as a backlight for liquid crystal displays, head mounted displays and in segmented instrument displays. The device of the present invention can also be used as a pn junction diode in electrical applications.

The device of the present invention is conveniently fabricated in a three step process. The first step involves disposing the composition between the first and second electrode. Suitably the composition can be dissolved in a suitable art known solvent such as p-xylene, methanol, anisole or mixtures thereof and applied as a thin film (0.1 to 10 μm) to the surface of one of the electrodes. The film is then dried and the second electrode formed or positioned on the backside of the film.

The second step of the process involves imposing a voltage (e.g., 10 volts) across the electrodes. The voltage causes migration of the anions and cations to opposite electrodes. To facilitate migration of the ions during fabrication of the device, the polymer is conveniently heated to an elevated temperature e.g., greater than 50° C. to provide the ions with an ionic mobility of greater than $10^{-17}$ m$^2$/volt·sec and complete the migration process within 3 hours.

The last step of the process involves immobilizing the nonuniform distribution of anions and cations in the polymer matrix. For polymers with a high glass transition temperature Tg (e.g., greater than 120° C.), immobilization can be accomplished by cooling the polymer in the applied field to ambient temperature to lock in the nonuniform distribution of ions in the rigid polymer matrix. Alternatively, the polymer can be crosslinked in the applied field to lock in the nonuniform distribution of ions. In another embodiment, the anion and cation can be provided with a polymerizable group which is activated by either electron transfer or photoionization. The resulting polycations and polyanions are immobilized in the polymer matrix due to their large steric bulk.

The device of the present invention has an improved dynamic response time. The device of the present invention will luminate light after a 12 hour rest period (voltage off) within 10 milliseconds after application of a threshold voltage to the electrodes preferably within 1 millisecond. Further, the device of the present invention utilizes less electrical power in switched applications e.g., displays because of the immobilized ion concentration gradients in the polymer matrix.

The following example is a detailed description of certain composition of the present invention. The detailed description falls within the scope of, and serves to exemplify, the more generally described compositions set forth above. The example is presented for illustrative purposes only, and is not intended as a restriction on the scope of the invention.

EXAMPLE 1

A composition comprising 0.8 weight % of poly[5-(2'ethyhexyloxy)-2-methoxy-1,4-phenylene vinylene] and 0.08 weight % of tetrabutylammonium toluenesulfonate was dissolved in p-xylene. A device was formed by casting the composition onto ITO coated glass and depositing metal electrodes onto the backside of the film of the composition by vacuum deposition.

Prior to heating the device, the device passed a current of $10^{-7}$ amps at 3 volts and no light was emitted. The device was then heated to 80° C. A voltage was again applied to the device and luminescence occurred after about 4 minutes. The heated devices was then cooled to ambient temperature with the voltage maintained. At room temperature, the device luminesces above 1.8 volts and at 3 volts gives light output of $10^{-6}$ Watts with luminous efficiency of 0.6 %. The voltage was then turned off for 14 hours. When the voltage was reapplied, the device emitted light instantaneously.

Although this invention has been described with respect to specific embodiments, the details thereof are not to be construed as limitations for it will be apparent that various embodiments, changes and modifications may be resorted to without departing from the spirit and scope thereof, and it is understood that such equivalent embodiments are intended to be included within the scope of this invention.

We claim:

1. A light emitting device comprising a light emitting composition disposed between a first and second electrode, the composition comprising a charge transporting polymer and a salt comprising immobilized anions and cations nonuniformly distributed in the polymer with the anion concentration being higher at the first electrode and the cation concentration being higher at the second electrode, the device emits light within 10 milliseconds after application of a voltage to the first and second electrode.

2. The device of claim 1 wherein the salt is an organic salt.

3. The device of claim 2 wherein the salt is a quaternary ammonium salt.

4. The device of claim 2 wherein the salt is selected from tetra $C_{1-6}$alkyl ammonium toluenesulfonate, tetra $C_{1-6}$ alkylammonium tetrafluoroborate and tetra $C_{1-6}$ alkyl ammonium tetraphenylborate.

5. The device of claim 3 wherein the polymer is selected from poly (phenylene vinylene), poly(fluorene) or poly (phenylene).

6. The device of claim 5 wherein the device emits light within 1 millisecond after application of a voltage to the first and second electrode.

7. A process for making a light emitting device comprising the steps of:

(i) disposing between a first and second electrode a composition comprising a charge transporting polymer and a salt comprising anions and cations;

(ii) heating the composition to an elevated temperature;

(iii) imposing voltage across the composition to cause migration of the anions and cations to opposite electrodes;

(iv) immobilizing the nonuniform distribution of the anions and cations in the polymer.

8. The process of claim 7 wherein the salt is an organic salt.

9. The process of claim 8 wherein the salt is a quaternary ammonium salt.

10. The process of claim 8 wherein the salt is selected from tetra $C_{1-6}$ alkyl ammonium toluenesulfonate, tetra $C_{1-6}$ alkylammonium tetrafluoroborate and tetra $C_{1-6}$ alkylammonium tetraphenylborate.

11. The process of claim 9 wherein the polymer is selected from poly (phenylene vinylene), poly(fluorene) or poly (phenylene).

* * * * *